United States Patent
Heiman et al.

(10) Patent No.: US 8,924,830 B2
(45) Date of Patent: *Dec. 30, 2014

(54) METHOD AND SYSTEM FOR DECODING CONTROL DATA IN GSM-BASED SYSTEMS USING INHERENT REDUNDANCY

(75) Inventors: Arie Heiman, Rannana (IL); Nelson Sollenberger, Farmingdale, NJ (US); Arkady Molev-Shteiman, Bney Barak (IL)

(73) Assignee: Broadcom Corporation, Irvine, CA (US)

( * ) Notice: Subject to any disclaimer, the term of this patent is extended or adjusted under 35 U.S.C. 154(b) by 220 days.

This patent is subject to a terminal disclaimer.

(21) Appl. No.: 13/277,017

(22) Filed: Oct. 19, 2011

(65) Prior Publication Data
US 2012/0039423 A1   Feb. 16, 2012

Related U.S. Application Data

(63) Continuation of application No. 11/325,720, filed on Jan. 5, 2006, now Pat. No. 8,046,662, and a continuation-in-part of application No. 11/189,509, filed on Jul. 26, 2005, now Pat. No. 7,716,565.

(60) Provisional application No. 60/603,148, filed on Aug. 20, 2004, provisional application No. 60/752,452, filed on Dec. 21, 2005.

(51) Int. Cl.
*H03M 13/03* (2006.01)
*H03M 13/09* (2006.01)
(Continued)

(52) U.S. Cl.
CPC ............ *H03M 13/09* (2013.01); *H03M 13/41* (2013.01); *H03M 13/6536* (2013.01); *H03M 13/4115* (2013.01); *H03M 13/4169* (2013.01); *H04L 1/005* (2013.01); *H04L 1/0054* (2013.01); *H04L 1/0061* (2013.01)

USPC .......................................................... 714/795

(58) Field of Classification Search
CPC . H03M 13/09; H03M 13/41; H03M 13/4115; H03M 13/6536; H04L 1/0061
USPC ................................ 714/746, 752, 786, 795
See application file for complete search history.

(56) References Cited

U.S. PATENT DOCUMENTS

| | | | |
|---|---|---|---|
| 5,208,816 A | 5/1993 | Seshadri | |
| 5,255,343 A | 10/1993 | Su | |

(Continued)

FOREIGN PATENT DOCUMENTS

| | | |
|---|---|---|
| CN | 1524360 | 8/2004 |
| EP | 1 056 212 A2 | 11/2000 |

(Continued)

OTHER PUBLICATIONS

Strauch et al., "Low Complexity Source Controlled Channel Decoding in a GSM System," 1999, IEEE, pp. 2571-2574.

(Continued)

*Primary Examiner* — Shelly A Chase
(74) *Attorney, Agent, or Firm* — Sterne, Kessler, Goldstein & Fox PLLC

(57) ABSTRACT

A method and system for decoding control data in GSM-based systems using inherent redundancy and physical constraints are presented. At least one estimated GSM-based bit sequence may be selected by performing searches that start from trellis junctions determined by the decoding algorithm. The estimated bit sequences may be selected based on corresponding redundancy verification parameters. At least one physical constraint test may be performed on the selected estimated GSM-based bit sequences to select a decoded output GSM-based bit sequence. A multilayer decoding process may comprise a burst process and a frame process. Results from a first burst process may be utilized to generate a decoded GSM bit sequence in the frame process. The frame process may utilize redundancy information and physical constraints to improve the performance of a decoding algorithm.

20 Claims, 17 Drawing Sheets

(51) Int. Cl.
*H03M 13/41* (2006.01)
*H04L 1/00* (2006.01)
*H03M 13/00* (2006.01)

(56) References Cited

U.S. PATENT DOCUMENTS

| | | | |
|---|---|---|---|
| 5,802,076 | A | 9/1998 | Weigland et al. |
| 5,881,105 | A | 3/1999 | Balachandran et al. |
| 5,920,597 | A | 7/1999 | Khayrallah et al. |
| 5,968,201 | A | 10/1999 | Shida et al. |
| 6,094,465 | A | 7/2000 | Stein et al. |
| 6,097,772 | A * | 8/2000 | Johnson et al. ............... 375/346 |
| 6,567,475 | B1 | 5/2003 | Dent et al. |
| 6,609,008 | B1 | 8/2003 | Whang et al. |
| 6,694,474 | B2 | 2/2004 | Ramprashad et al. |
| 6,799,294 | B1 | 9/2004 | Chung et al. |
| 6,922,797 | B2 | 7/2005 | Joncour |
| 7,058,132 | B1 | 6/2006 | Sebire et al. |
| 7,061,999 | B2 | 6/2006 | Chen |
| 7,218,665 | B2 | 5/2007 | McAlwain |
| 7,257,760 | B2 | 8/2007 | Rick et al. |
| 7,274,747 | B1 * | 9/2007 | Lobo ............................ 375/295 |
| 7,487,430 | B2 | 2/2009 | Kim et al. |
| 8,046,662 | B2 * | 10/2011 | Heiman et al. ................ 714/758 |
| 2002/0119773 | A1 * | 8/2002 | Niemela ....................... 455/423 |
| 2003/0152169 | A1 * | 8/2003 | Chen ............................ 375/340 |
| 2004/0081248 | A1 * | 4/2004 | Parolari ........................ 375/259 |
| 2004/0199858 | A1 * | 10/2004 | Becker et al. ................. 714/795 |
| 2005/0030914 | A1 | 2/2005 | Binzel et al. |
| 2006/0288407 | A1 | 12/2006 | Naslund et al. |

FOREIGN PATENT DOCUMENTS

| | | |
|---|---|---|
| EP | 1 467 492 A | 10/2004 |
| EP | 1 542 388 A1 | 6/2005 |
| WO | WO 96/08904 A | 3/1996 |
| WO | WO 01/20838 A | 3/2001 |

OTHER PUBLICATIONS

Chen et al., "An Integrated Error Correction and Detection System for Digital Audio Broadcasting," Mar. 2000, IEEE Trans. on Broadcasting, vol. 46, No. 1, pp. 68-78.

Chen et al., "List Viterbi Algorithms for Wireless Systems," VTC 2000—Spring, IEEE 51st Vehicular Technology Conference, New York, NY: IEEE, US; vol. 2 of 3 CONF 51; May 15, 2000; pp. 1016-1020.

Laneman, J.N., "Huffman Code Based Error Screening and Channel Code Optimization for Error Concealment in Perceptual Audio Coding (PAC) Algorithms," IEEE Transactions on Broadcasting; vol. 48, No. 3, Sep. 2002, pp. 193-206.

Leanderson et al., "Joint Source Channel List Sequence Decoding," 2002, IEEE, pp. 951-955.

Austin, M., Ph.D., "SAIC and Synchronized Networks for Increased GSM Capability," Sep. 2003, pp. 1-26.

Lei Cao et al., "Constrained SOVA Decodingin Concatenated Codes," Wireless Communications and Networking Conference, WCNC, IEEE, vol. 4, No. 21, Mar. 2004, pp. 2280-2284.

European Search Report directed to EP Application No. 06 01 8896, dated May 10, 2013, European Patent Office, Munich, Germany; 7 pages.

European Search Report directed to related European Patent Application No. 06 018 896.8-1860, mailed Apr. 17, 2014.

* cited by examiner

METHOD AND SYSTEM FOR DECODING CONTROL DATA IN GSM-BASED SYSTEMS USING INHERENT REDUNDANCY

CROSS-REFERENCE TO RELATED APPLICATIONS/INCORPORATION BY REFERENCE

This application is a continuation of U.S. patent application Ser. No. 11/325,720, filed Jan. 5, 2006, now U.S. Pat. No. 8,046,662, issued Oct. 25, 2011, which claims the benefit of U.S. provisional application Ser. No. 60/752,452, filed Dec. 21, 2005 and is a continuation-in-part of U.S. patent application Ser. No. 11/189,509, filed Jul. 26, 2005, now U.S. Pat. No. 7,716,565, issued May 11, 2010, which makes reference to, claims priority to, and claims the benefit of U.S. provisional application Ser. No. 60/603,148, filed on Aug. 20, 2004.

This application makes reference to:
U.S. application Ser. No. 11/325,721, filed Jan. 5, 2006, now U.S. Pat. No. 7,643,993 issued Jan. 5, 2010;
U.S. application Ser. No. 11/325,751, filed Jan. 5, 2006, now U.S. Pat. No. 7,809,091 issued Oct. 5, 2010;
U.S. application Ser. No. 11/325,808, filed Jan. 5, 2006 now U.S. Pat. No. 7,796,711 issued Sep. 14, 2010;
U.S. application Ser. No. 11/326,066, filed Jan. 5, 2006, now U.S. Pat. No. 7,587,211 issued Sep. 8, 2009;
U.S. application Ser. No. 11/325,759, filed Jan. 5, 2006, now U.S. Pat. No. 7,693,531 issued Apr. 6, 2010; and
U.S. application Ser. No. 11/189,634, filed Jul. 26, 2005, now U.S. Pat. No. 7,706,481 issued Apr. 27, 2010.

Each of the above stated applications is hereby incorporated herein by reference in its entirety.

FIELD OF THE INVENTION

Certain embodiments of the invention relate to receivers utilized in wired and wireless communication systems. More specifically, certain embodiments of the invention relate to a method and system for decoding control data in GSM-based systems using inherent redundancy.

BACKGROUND OF THE INVENTION

The evolution from wireless based voice only communication networks to wireless based voice and data communication networks has resulted in the development of general packet radio service (GPRS) and enhanced data rates for the global system for mobile communications (GSM) standards. Although speech still remains the dominant service by many cellular service providers, existing systems are being upgraded to provide greater support for data communication via the radio interface.

The GSM standard, for example, provides data services with bit rates up to 14.4 kbps for circuit-switched data and up to 22.8 kbps for packet based (non-circuit switched) data. For GSM, higher bit rates may be achieved utilizing technological advancements such as high-speed circuit-switched data (HSCSD) technology and general packet radio service (GPRS) technology, which are based on the original gaussian minimum shift keying (GMSK) modulation scheme employed by GSM. In eight-state phase shift keying (8PSK), there are eight possible states that a signal can transition to at any time. 8PSK is a variation of PSK and has a symbol rate that is one third of the bit rate. Minimum Shift Keying (MSK) is used in the GSM cellular standard. Frequency Shift Keying (FSK) and MSK produce constant envelope carrier signals, which have no amplitude variations, a desirable characteristic for improving power efficiency of transmitters. In practice, waveforms are filtered with a gaussian filter, resulting in a narrow spectrum and no time domain overshoot. MSK with a gaussian filter is termed GMSK. GMSK is a spectrally efficient modulation scheme and is useful in mobile radio systems. GMSK has a constant envelope, spectral efficiency, good bit error rate (BER) performance, and is self-synchronizing.

Enhanced data for global evolution (EDGE) provides an enhancement to GPRS, which leverages a new modulation scheme along with various coding and radio link enhancements to provide much higher bit rates and capacity than GPRS. Due to the higher bit rates and the need to adapt the data protection to the channel and link quality, the EDGE radio link control (RLC) protocol is somewhat different from the corresponding GPRS protocol. EDGE is a 3G technology that delivers broadband-like data speeds to mobile devices. It allows consumers to connect to the Internet and to send and receive data, including digital images, web pages and photographs, three times faster than possible with an ordinary GSM and or GPRS networks. EDGE enables GSM operators to offer higher-speed mobile-data access, serve more mobile-data customers, and free up GSM network capacity to accommodate additional voice traffic.

In some conventional receivers, improvements may require extensive system modifications that may be very costly and, in some cases, may even be impractical. Determining the right approach to achieve design improvements may depend on the optimization of a receiver system to a particular modulation type and/or to the various kinds of noises that may be introduced by a transmission channel. For example, the optimization of a receiver system may be based on whether the signals being received, generally in the form of successive symbols or information bits, are interdependent. Signals received from, for example, a convolutional encoder, may be interdependent signals, that is, signals with memory. In this regard, a convolutional encoder may generate NRZI or continuous-phase modulation (CPM), which is generally based on a finite state machine operation.

One method or algorithm for signal detection in a receiver system that decodes convolutional encoded data is maximum-likelihood sequence detection or estimation (MLSE). The MLSE is an algorithm that performs soft decisions while searching for a sequence that minimizes a distance metric in a trellis that characterizes the memory or interdependence of the transmitted signal. In this regard, an operation based on the Viterbi algorithm may be utilized to reduce the number of sequences in the trellis search when new signals are received.

Another method or algorithm for signal detection of convolutional encoded data that makes symbol-by-symbol decisions is maximum a posteriori probability (MAP). The optimization of the MAP algorithm is based on minimizing the probability of a symbol error. In many instances, the MAP algorithm may be difficult to implement because of its computational complexity.

The Viterbi algorithm may be utilized to perform the maximum likelihood decoding of convolutional codes. When a signal has no memory, a symbol-by-symbol detector may be utilized to minimize the probability of a symbol error. When a transmitted signal has memory, the signals transmitted in successive symbol intervals are interdependent. An optimum detector for a signal with memory may base its decisions on observation of a sequence of received signals over successive signal intervals. A maximum likelihood sequence detection algorithm may search for the minimum Euclidean distance path through a trellis that characterizes the memory in the transmitted signal.

Improvements in the design and implementation of optimized receivers for decoding convolutional encoded data may require modifications to the application of the MLSE algorithm, the Viterbi algorithm, and/or the MAP algorithm in accordance with the modulation method utilized in signal transmission.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for decoding control data in GSM-based systems using inherent redundancy, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

A method and system for decoding control data in GSM-based systems using inherent redundancy and physical constraints are presented. At least one estimated GSM-based bit sequence may be selected by performing searches that start from trellis junctions determined by the decoding algorithm. The estimated bit sequences may be selected based on corresponding redundancy verification parameters. At least one physical constraint test may be performed on the selected estimated GSM-based bit sequences to select a decoded output GSM-based bit sequence. A multilayer decoding process may comprise a burst process and a frame process. Results from a first burst process may be utilized to generate a decoded GSM bit sequence in the frame process. The frame process may utilize redundancy information and physical constraints to improve the performance of a decoding algorithm. Results from the frame process may be fed back for a second iteration of the burst process and the frame process, to further improve the decoding operation. In some instances, the second iteration of the burst process may be based on a gradient search approach.

Figure 1A:
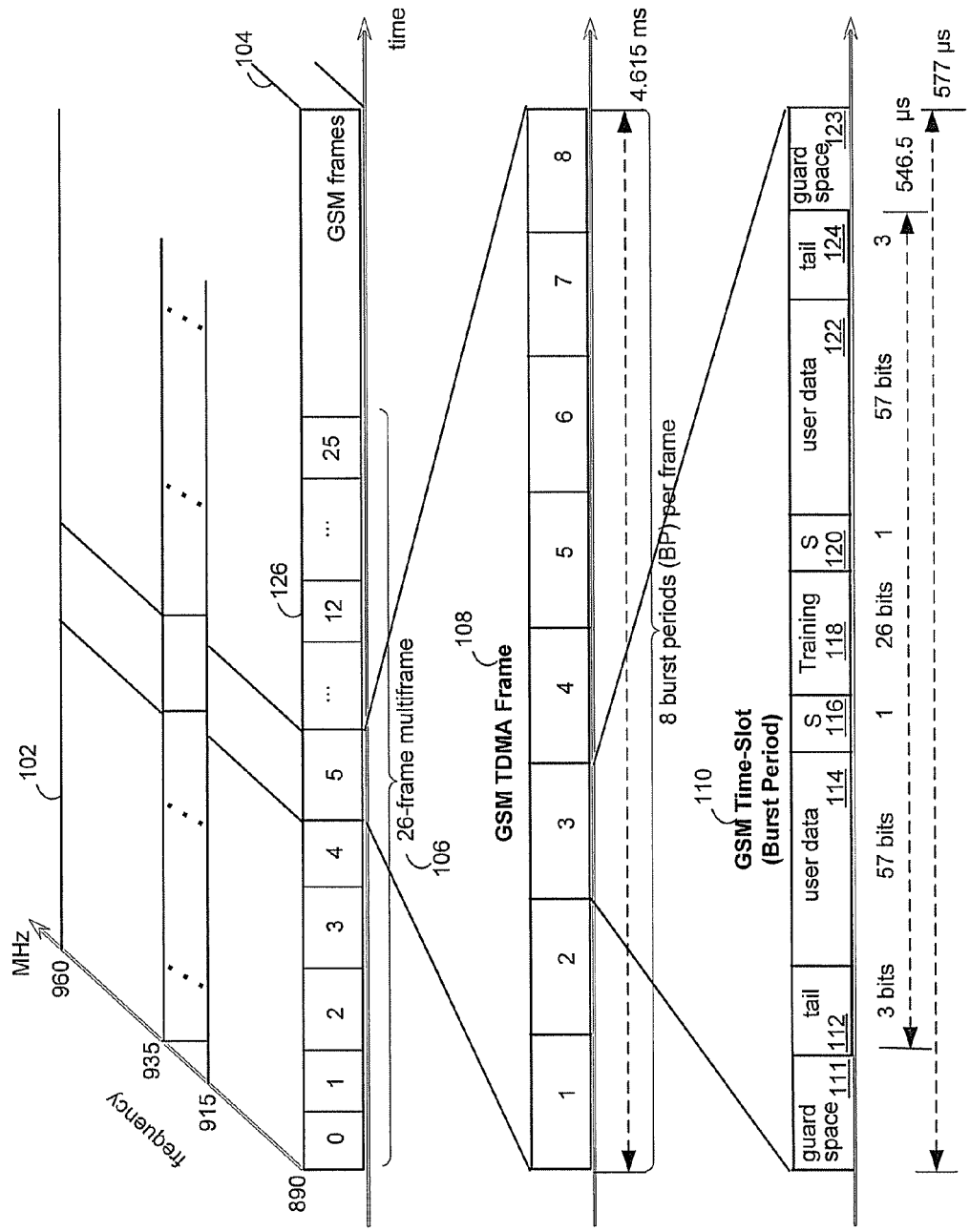
FIG. 1A is a graph illustrating an exemplary GSM frame and a burst period, which may be used in accordance with an embodiment of the invention.

FIG. 1A is a graph illustrating an exemplary GSM frame and a burst period, which may be used in connection with an embodiment of the invention. GSM utilizes a combination of Time and Frequency Division Multiple Access (TDMA/FDMA). Referring to FIG. 1A, there is shown a downlink frequency band 102, an uplink frequency band 104, a GSM TDMA frame 108 and a GSM timeslot or burst period 110. The GSM downlink frequency band 102 comprises a range of 935-960 MHz and the GSM uplink frequency band comprises a range of 104 is 890-915 MHz. The FDMA aspect of GSM involves the division of frequency of the 25 MHz bandwidth for the uplink frequency band 104 and the downlink frequency band 102 into 124 carrier frequencies, each of which comprises a bandwidth of 200 kHz. One or more carrier frequencies may be assigned per base station. The TDMA aspect of GSM involves the division in time of each carrier frequency into 8 time-slots, or burst periods (BPs), such as BP 110. One time-slot may be used for transmission by a mobile station and one time-slot may be used for reception.

The GSM timeslot or BP 110 may comprise tail portions 112 and 124, user data portions 114 and 122 stealing bits 116 and 120, a training sequence 118, and guard space 111 and 123. The tail portions 112 and 124 may each comprise 3 bits, for example, and may be utilized as separators. The user data portions 114 and 122 may each comprise 57 bits, for example, and may be used for data transmission. The stealing bits 116 and 120 may each comprise 1 bit and may be used by fast associated control channel (FACCH) messages. The training sequence 118 may comprise 26 bits, for example, and may be utilized by a mobile station receiver to synchronize and compensate for time dispersion produced by multipath propagation. The guard space 111 and 123 may each comprise 8.25 bits, for example, and may allow for propagation time delay in the arrival of bursts. The burst period 110 may be transmitted in 0.577 milliseconds.

Each group of 8 time-slots or burst periods, such as the burst period 110, may form a GSM TDMA frame 108. The GSM frame 108 may be transmitted every 4.615 ms. The GSM frames, such as the GSM frame 108, may be further grouped into multiframes. A GSM multiframe may comprise 26 TDMA frames or 51 TDMA frames. For example, the GSM multiframe 106 may comprise 26 TDMA frames, numbered 0, 1, . . . , 25. The 26-frame multiframe 106 may comprise 24 traffic channels (TCH), which may be communicated in frames 0, 1, . . . , 11 and frames 13, 14, . . . , 24. The $13^{th}$ frame 126 may be used for communicating a slow associated control channel (SACCH) block. The last $25^{th}$ frame is currently not used in GSM-based systems.

Figure 1B:
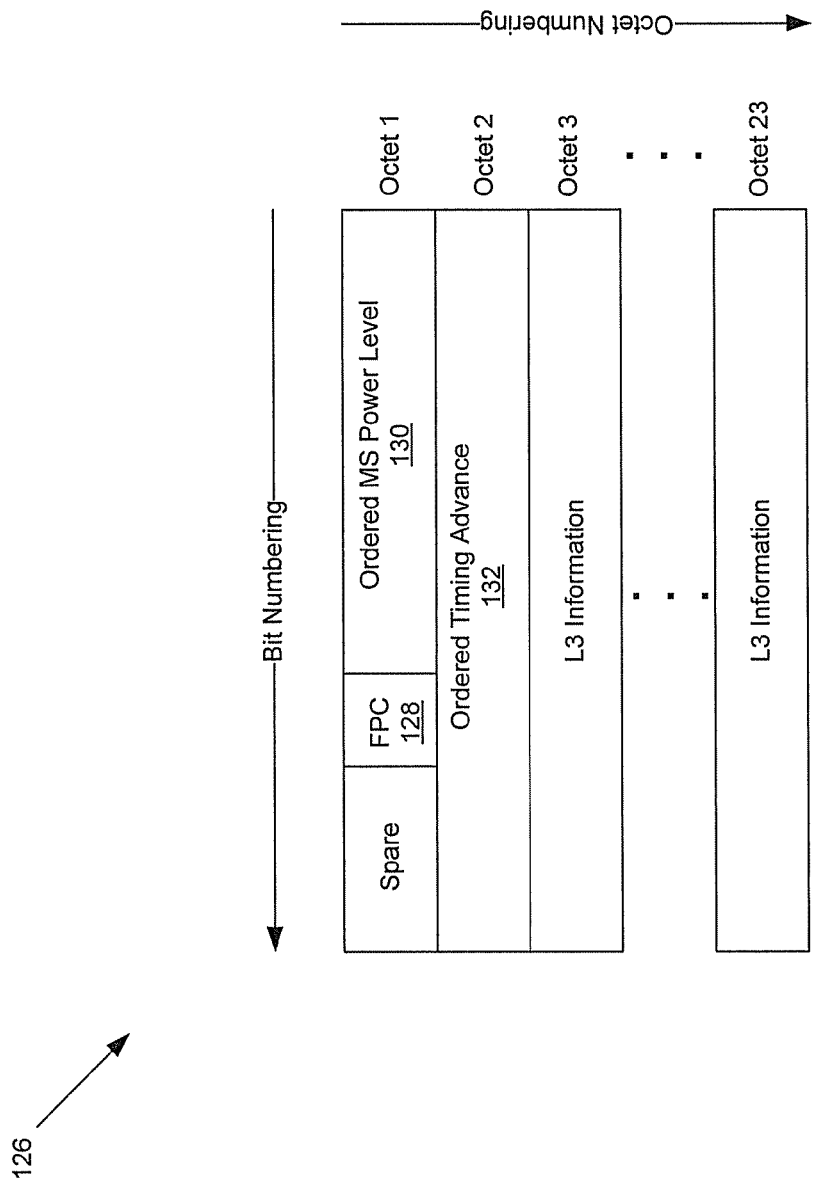
FIG. 1B is a block diagram of an exemplary slow associated control channel (SACCH) block, which may be used in accordance with an embodiment of the invention.

FIG. 1B is a block diagram of an exemplary slow associated control channel (SACCH) block, which may be used in accordance with an embodiment of the invention. Referring to FIG. 1B, the SACCH block 126 may comprise 23 octets for a total of 184 bits. Octets 1 and 2 may comprise level 1 (L1) control information and octets 3, 4, . . . , 23 may comprise level 3 (L3) system information. The L1 control information may comprise fast power control (FPC) bit information 128, ordered mobile station power level 130, and ordered timing advance 132. The spare bits within the SACCH block 126 may be encoded with the binary value 0, for example.

The FPC bit 128 may have a different interpretation depending on the channel mode of the channel to which the SACCH 126 is associated. For example, if the channel mode for a wireless connection is such that FPC may be used, the FPC bit 128 may indicate whether Fast Measurement Reporting and Power Control mechanism may be used. The FPC bit 128 may be coded as 0 when fast power control is not used, and 1 when fast power control is in use.

The ordered mobile station (MS) power level 130 may be used by a base station, for example, to indicate a desired transmission power level to an associated mobile station. The ordered timing advance information 132 may be communicated from a base station (BS) to an associated MS and may be used by the MS to advance its timings of transmissions to the BS so as to compensate for propagation delay.

During wireless communication of data between a BS and a MS, L3 system information in octets 3, . . . , 23 may stay unchanged. In instances when the MS is in handover or when receiving short messages, for example, L3 system information in the SACCH block 126 may change. In this regard, a continuous transmission of SACCH blocks in both uplink and downlink paths may be essential to proper exchange of data for an established wireless connection or for a wireless connection in handover. For example, an uplink path may be used by a MS to communicate measurement result messages to the BS via the SACCH 126. Similarly, a downlink path may be used by the BS to communicate system information and measurement messages to the MS via the SACCH 126.

Figure 2A:
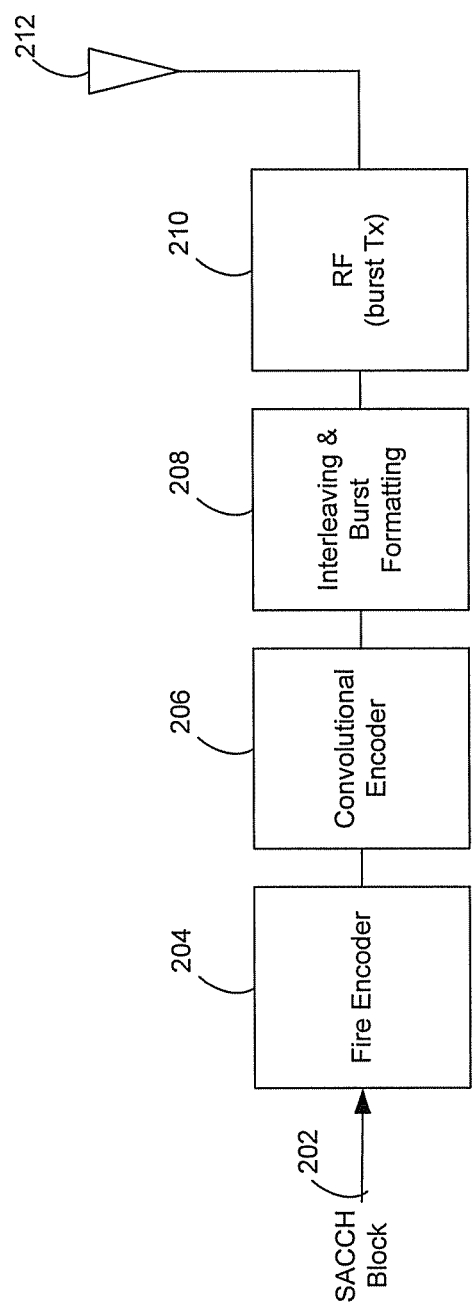
FIG. 2A is a block diagram of an exemplary base station (BS) for encoding and transmission of information, in accordance with an embodiment of the invention.

FIG. 2A is a block diagram of an exemplary base station (BS) for encoding and transmission of information, in accordance with an embodiment of the invention. Referring to FIG. 2A, the base station 200 may comprise a fire encoder 204, a convolutional encoder 206, an interleaving and burst formatting block (IBFB) 208, a radio frequency block (RFB) 210, and an antenna 212.

The fire encoder 204 may comprise suitable circuitry, logic, and/or code and may enable block coding of received bit sequence, such as the SACCH block 202. The fire encoder 204 may append the received 184 bits of the received SACCH block 202 with 40 parity bits. The 40 parity bits may be calculated by the encoder 204 based on the SACCH block 202 and may be used by a receiver during error correction. Furthermore, the 40 parity bits may be used for correction of a burst of errors, such as 12 errors within a single portion of transmitted data.

The convolutional encoder 206 may comprise suitable circuitry, logic, and/or code and may enable one-half rate encoding of fire encoded data. The convolutional encoder 206 may utilize multiplication by a finite-field polynomial and may generate 2 encoded bits for each input bit. In this regard, the number of bits at the output of the convolutional encoder 206 is double the number of input bits at the input of the encoder 206.

The IBFB 208 may comprise suitable circuitry, logic, and/or code and may enable interleaving of encoded bits so that sequential coded bits are not next to each other during transmission. In this regard, interleaving may be used for randomizing errors in a transmit channel. The IFBF 208 may also enable burst formatting or adding framing bits to the interleaved encoded bitstream, resulting in burst formation. Burst formatting may comprise, for example, adding a training sequence to the interleaved and encoded bitstream.

The RFB 210 may comprise suitable circuitry, logic, and/or code and may enable further processing, such as modulation, signal amplification and filtering of the interleaved and burst-formatted signal received form the IBFB 208. The resulting RF signal may be transmitted via the antenna 212.

Figure 2B:
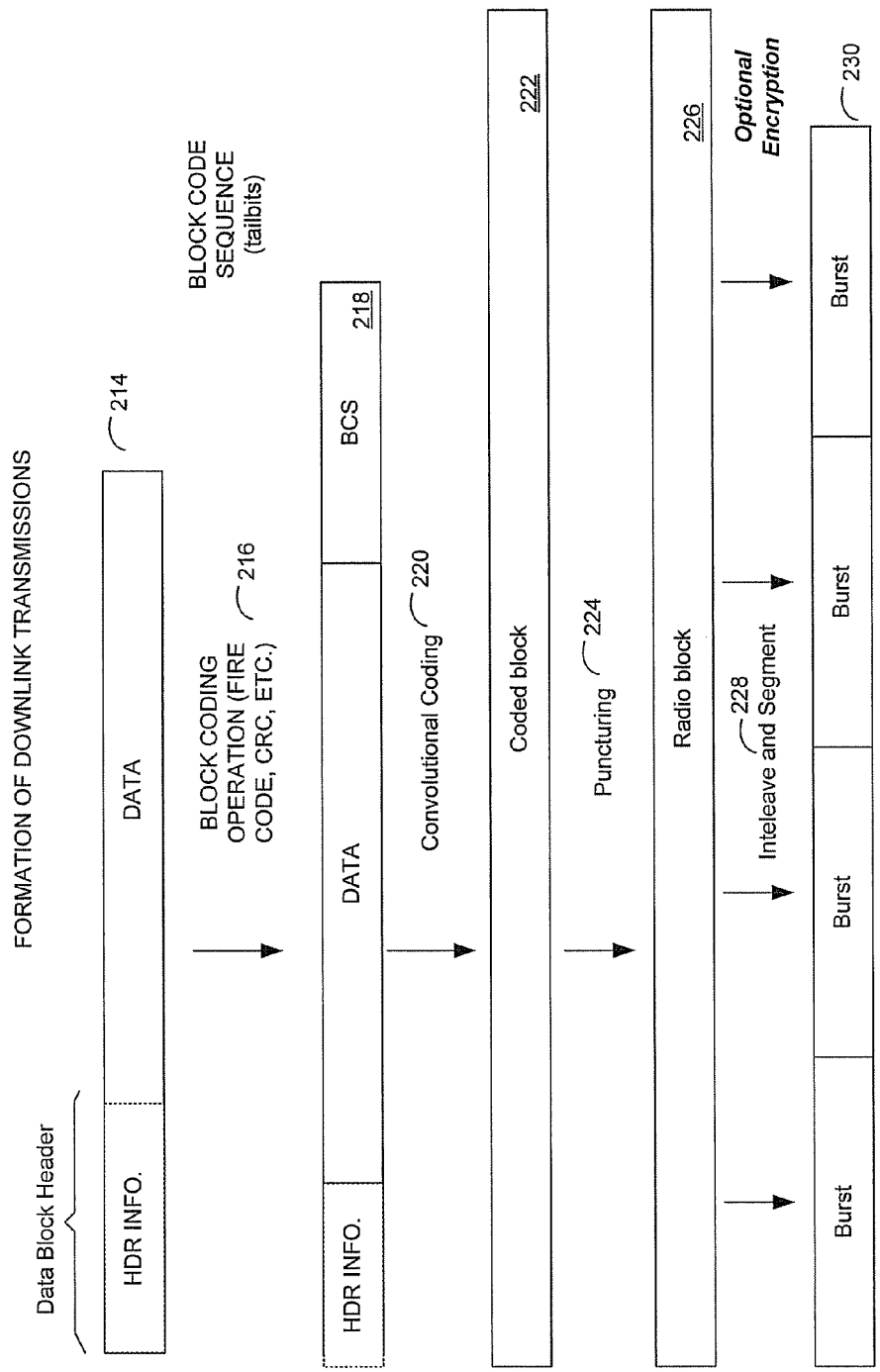
FIG. 2B is a block diagram illustrating formation of an exemplary downlink transmission, in accordance with an embodiment of the invention.

FIG. 2B is a block diagram illustrating formation of an exemplary downlink transmission, in accordance with an embodiment of the invention. Referring to FIGS. 2A and 2B, data 214, such as the 168-bits of L3 information within the SACCH block 202, may be initially uncoded and maybe accompanied by a data block header, such as the 16-bits of L1 information within the SACCH block 202. Block coding operations 216 may then be performed on the data block 214 resulting in a block coding sequence (BCS) 218, which is appended to the data 214. The block coding operation 216 may be used for error detection/correction for the data block 214 and may comprise a cyclic redundancy check (CRC) or a Fire Code operation.

Fire codes allow for either error correction or error detection. Fire Codes are a shortened binary cyclic code that appends redundancy bits to bits of the data Header and Data. After block coding has supplemented the data 214 with redundancy bits for error detection, convolutional coding 220 may be performed by the convolutional encoder 206 for calculation of additional redundancy for error correction to correct the transmissions caused by the radio channels. The convolutional encoding operation 220 may result in a coded data block 222. Some redundant bits generated by the convolutional encoder 206 may be punctured prior to transmission via the puncturing operation 224 to generate a radio block 226. In this regard, puncturing may increase the rate of the convolutional code and may reduce the redundancy per data block transmitted. In addition, puncturing may lower the bandwidth requirements such that the convolutional encoded signal may fit into the available channel bit stream. The convolutional encoded punctured bits of the radio block 226 may be communicated to the IBFB 208, which may shuffle various bit streams and segments of the interleaved bit streams into the 4 bursts 230. The bursts 230 may be further modulated and converted to RF by the RFB 210. The RF bursts may be transmitted via the antenna 212.

Figure 3A:
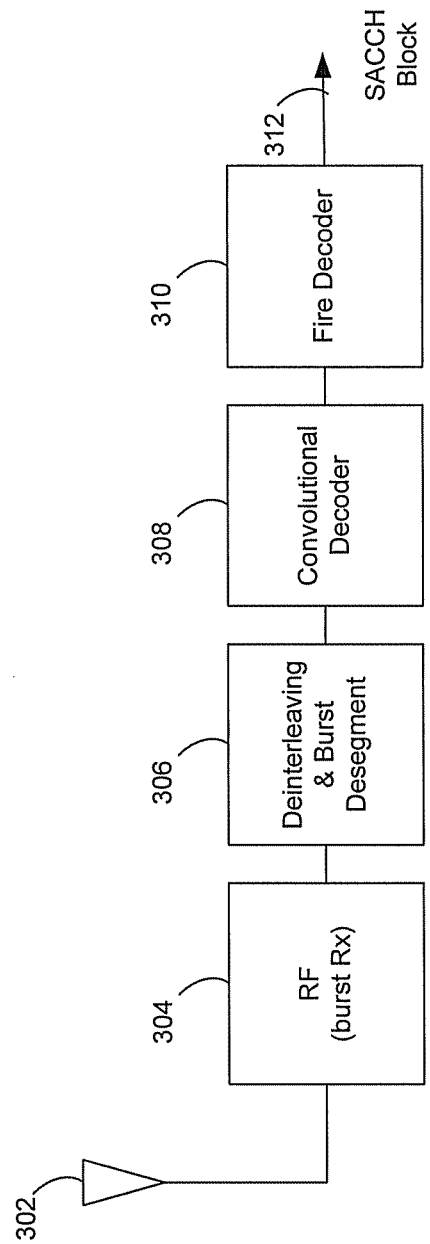
FIG. 3A is a block diagram of an exemplary mobile station (MS) for recovery of received data, in accordance with an embodiment of the invention.

FIG. 3A is a block diagram of an exemplary mobile station (MS) for recovery of received data, in accordance with an embodiment of the invention. Referring to FIG. 3A, the mobile station 300 may comprise a radio frequency block (RFB) 304, an antenna 302, a deinterleaver and burst desegmentation block (DBDB) 306, a convolutional decoder 308, and a fire decoder 310.

The RFB 304 may comprise suitable circuitry, logic, and/or code and may enable processing of RF bursts received via the antenna 302. For example, the RFB 304 may enable downconversion, signal amplification and filtering of the received RF bursts to generate interleaved and burst-formatted encoded bitstream data.

The DBDB 306 may comprise suitable circuitry, logic, and/or code and may enable deinterleaving of interleaved bitstream data. The DBDB 306 may also enable burst desegmentation by removing framing bits from the received bitstream data.

The convolutional decoder 308 may comprise suitable circuitry, logic, and/or code and may enable one-half rate decoding of the deinterleaved and desegmented data received from the DBDB 306. The convolutional decoder 308 may utilize Viterbi decoding to provide error correction, and may generate, for example, 1 decoded bit for each 2 input encoded bits. The Viterbi decoded data may be communicated to the fire decoder 310. The fire decoder 310 may comprise suitable circuitry, logic, and/or code and may enable decoding of a bit sequence received from the Viterbi decoder 308. The fire decoder 310 may extract 40 parity bits from the received bit sequence, generating 184 bits of the received SACCH block 312. The extracted 40 parity bits may be used by the fire decoder 310 to perform a Fire Code verification check for error detection within the SACCH block 312.

Figure 3B:
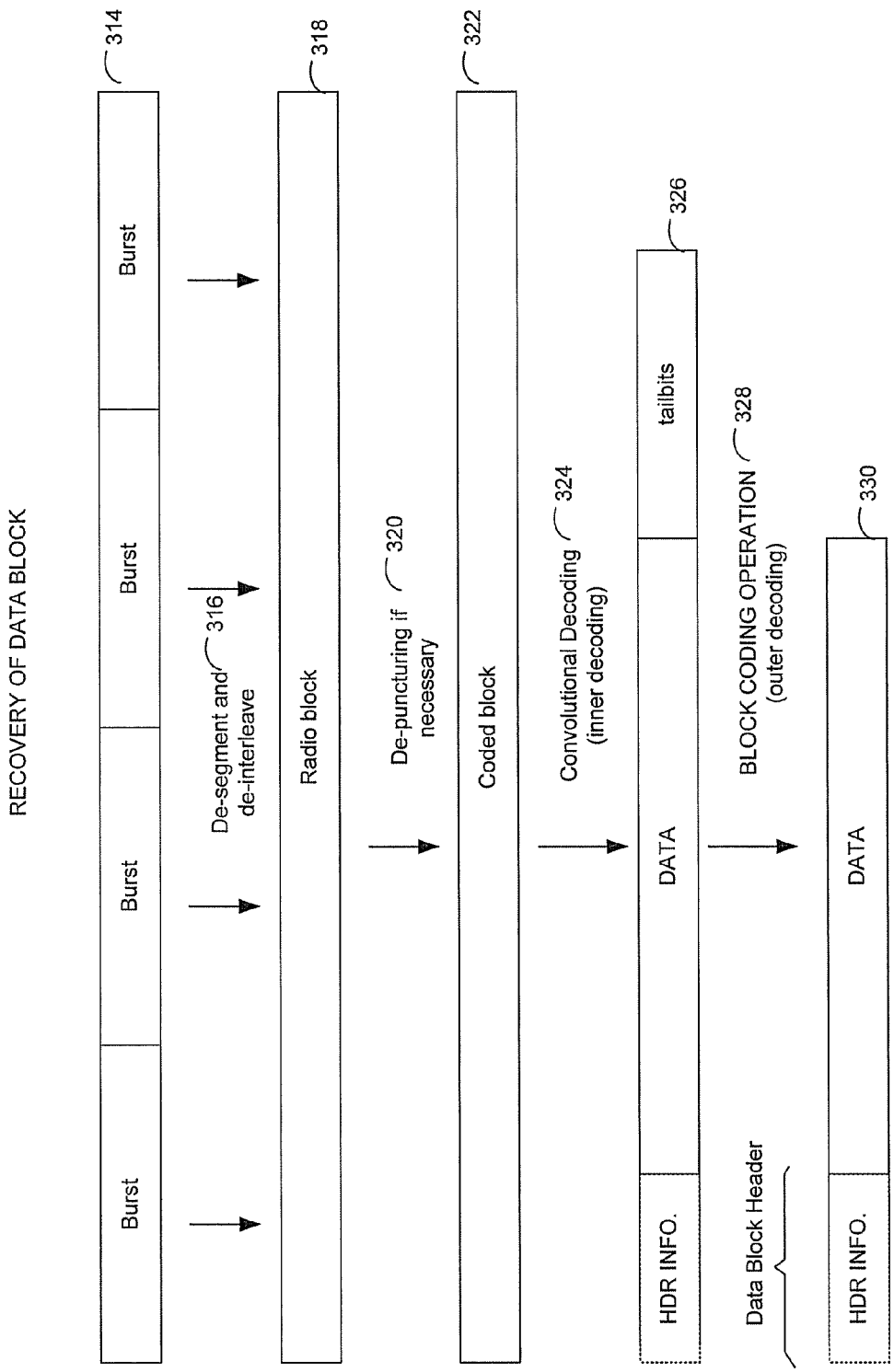
FIG. 3B is a block diagram illustrating recovery of data within a mobile station (MS), in accordance with an embodiment of the invention.

FIG. 3B is a block diagram illustrating recovery of data within a mobile station (MS), in accordance with an embodiment of the invention. Referring to FIGS. 3A and 3B, interleaved and segmented bursts 314 may be received by the DBDB 306. The DBDB 306 may apply a desegmentation and deinterleaving operation 316 to generate an encoded radio block 318. The encoded radio block 318 may be communicated to the Viterbi decoder 308 and a depuncturing operation 320 may be performed by the Viterbi decoder 308 to generate a coded block 322. A convolutional decoding operation 324 may be applied to the coded block 322 to generate the header information, data and tailbits 326. The generated header, data and tailbits information 326 may be communicated to the fire decoder 310. The fire decoder 310 may apply a block decoding operation or an outer decoding operation 328 to extract the tailbits and generate header information and data 330.

Figure 4A:
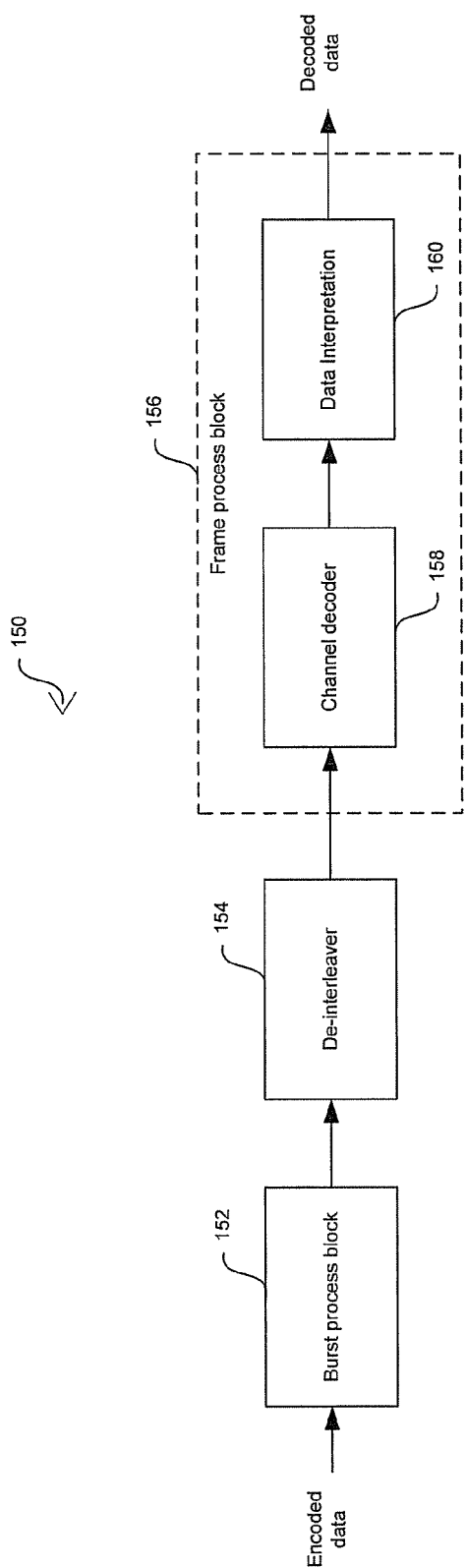
FIG. 4A is a block diagram illustrating a multilayer system for improving decoding of a received GSM bit sequence, in accordance with an embodiment of the invention.

FIG. 4A is a block diagram illustrating a multilayer system for improving decoding of a received GSM bit sequence, in accordance with an embodiment of the invention. Referring to FIG. 4A, there is shown a receiver 150 that comprises a burst process block 152, a de-interleaver 154, and a frame process block 156. The frame process block 156 may comprise a channel decoder 158 and a data interpretation block 160. The receiver 150 may comprise suitable logic, circuitry, and/or code that may operate as a wired or wireless receiver. The receiver 150 may utilize redundancy to decode interdependent signals, for example, signals that comprise convolutional encoded data. The receiver 150 may also utilize a multilayer approach for improving the decoding of interdependent signals or signals with memory. In this regard, the receiver 150 may perform a burst process and a frame process when processing the received interdependent signals. The multilayer approach performed by the receiver 150 may be compatible with a plurality of modulation standards.

The burst process block 152 may comprise suitable logic, circuitry, and/or code that may perform the burst process portion of the decoding operation of the receiver 150. The burst process block 152 may comprise, for example, a channel estimation operation and a channel equalization operation. Results from the channel estimation operation may be utilized by the channel equalization operation to generate a plurality of data bursts based on a maximum-likelihood sequence estimation (MLSE) operation. The output of the burst process block 152 may be transferred to the de-interleaver 154. The de-interleaver 154 may comprise suitable logic, circuitry, and/or code that may multiplex bits from a plurality of data bursts received from the burst process block 152 to form the frame inputs to the frame process block 106. Interleaving may be utilized to reduce the effect of channel fading distortion, for example.

The channel decoder 158 may comprise suitable logic, circuitry, and/or code that may decode the bit sequences in the input frames received from the de-interleaver 154. The channel decoder 158 may utilize the Viterbi algorithm during a Viterbi operation to improve the decoding of the input frames. The data interpretation block 160 may comprise suitable logic, circuitry, and/or code that may perform content specific processing operations on the results of the channel decoder 158.

Regarding the frame process operation of the decoder 150, a standard approach for decoding convolution encoded data is to find the maximum-likelihood sequence estimate (MLSE) for a bit sequence. This may involve searching for a sequence X in which the conditional probability P(X/R) is a maximum, where X is the transmitted sequence and R is the received sequence, by using, for example, the Viterbi algorithm. In some instances, the received signal R may comprise an inherent redundancy as a result of the encoding process by the signals source. This inherent redundancy may be utilized in the decoding process by developing a MLSE algorithm that may meet at least some of the physical constraints of the signals source. The use of physical constraints in the MLSE may be expressed as finding a maximum of the conditional probability P(X/R), where the sequence X meets a set of physical constraints C(X) and the set of physical constraints C(x) may depend on the source type and on the application. In this regard, the source type may be a voice, control data, music and/or a video source type.

Figure 4B:
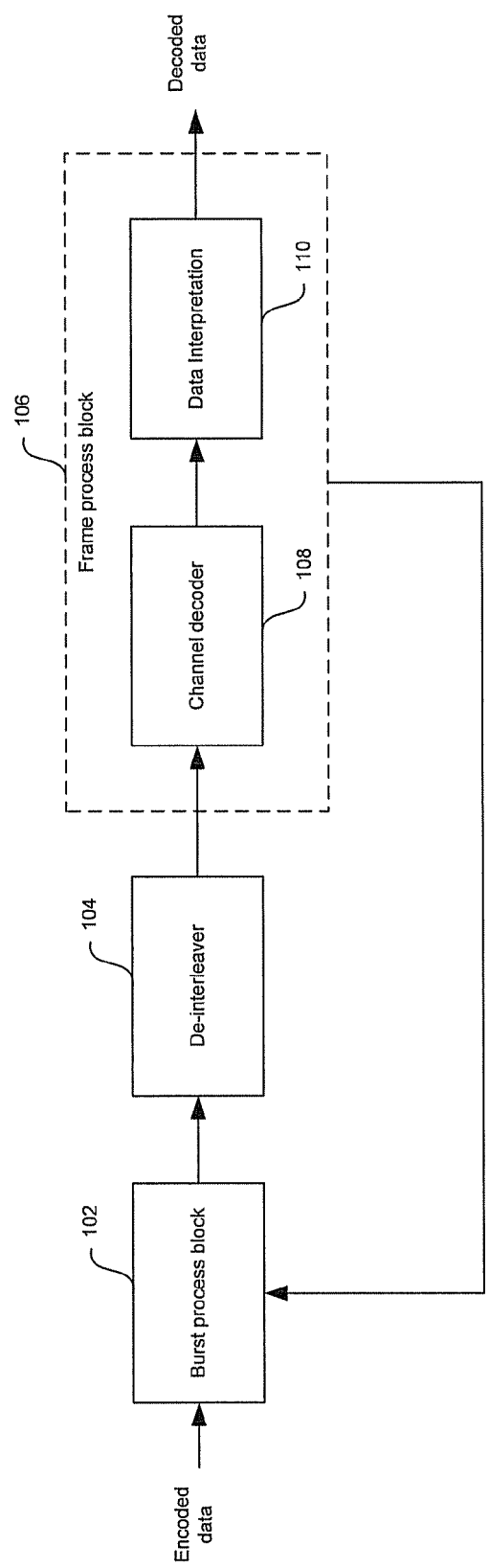
FIG. 4B is a block diagram illustrating an iterative multilayer approach for improving decoding of a received GSM bit sequence, in accordance with an embodiment of the invention.

FIG. 4B is a block diagram illustrating an iterative multilayer approach for improving decoding, in accordance with an embodiment of the invention. Referring to FIG. 4B, there is shown the receiver 150 in FIG. 4A with a feedback signal from the frame process portion of the multilayer decoding approach to the burst process portion of the multilayer decoding approach. The frame process may comprise the use of redundancy verification of the results generated by the Viterbi algorithm and the use of physical constraints to reduce decoding errors that may result from the standard Viterbi algorithm. The burst process may utilize information decoded in the frame process as an input to improve the channel estimation and channel equalization operations.

Figure 4C:
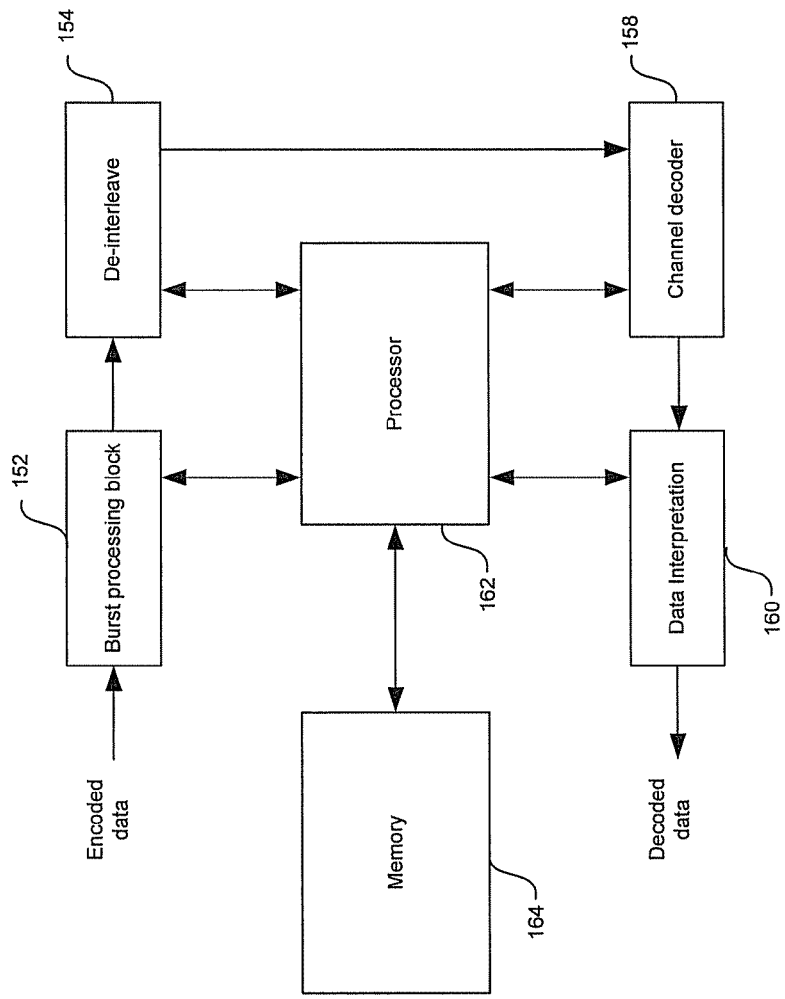
FIG. 4C is a block diagram illustrating a multilayer system with a processor and memory for improving decoding, in accordance with an embodiment of the invention.

FIG. 4C is a block diagram illustrating a multilayer system with a processor and memory for improving decoding, in accordance with an embodiment of the invention. Referring to FIG. 4C, there is shown a processor 162, a memory 164, the burst process block 152, a de-interleaver 154, the channel decoder 158 and the data interpretation block 160. The processor 162 may comprise suitable logic, circuitry, and/or code that may perform computations and/or management operations. The processor 162 may also be adapted to communicate and/or control at least a portion of the operations of the burst process block 152, the de-interleaver 154, the channel decoder 158 and the data interpretation block 160. The memory 164 may comprise suitable logic, circuitry, and/or code that may store data and/or control information. The memory 164 may store information that may be utilized and/or that may be generated by the burst process block 152, the de-interleaver 154, the channel decoder 158 and the data interpretation block 160. In this regard, information may be transferred to and from the memory 164 via the processor 162, for example.

Figure 5:
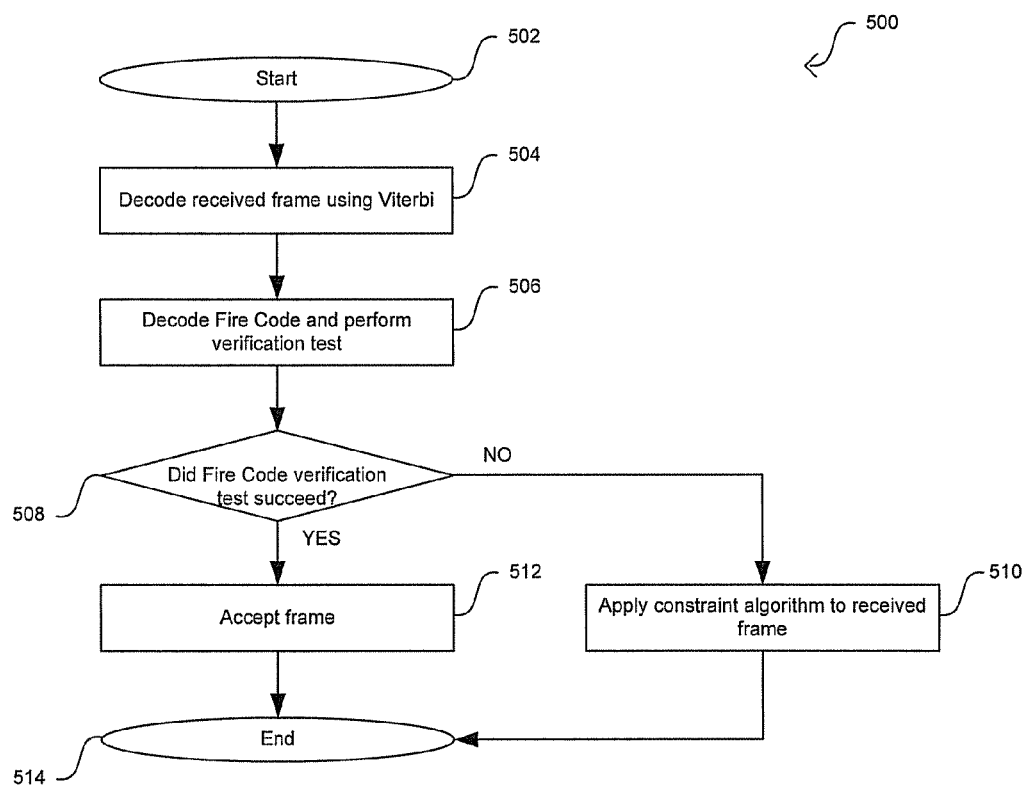
FIG. 5 is a flow diagram illustrating exemplary steps in the application of redundancy to a multilayer process, in accordance with an embodiment of the invention.

FIG. 5 is a flow diagram illustrating exemplary steps in the application of redundancy to a multilayer process, in accordance with an embodiment of the invention. Referring to FIG. 5, after start step 502, in step 504, the receiver 150 in FIG. 4A may decode a received frame in the frame process block 156 by utilizing the Viterbi algorithm. In step 506, Fire code is decoded and checks if the decoded process was successful. In step 508, the receiver 150 may determine whether the Fire decode verification test was successful. When the test verifies the decoded frame, the receiver 150 may proceed to step 512 where the decoded frame is accepted. After step 512, the receiver 150 may proceed to end step 514.

Returning to step 508, when the verification test is not successful for the decoded frame, the receiver 150 may proceed to step 510. In step 510, the receiver 150 may perform a redundancy algorithm that may be utilized to provide a decoding performance that may result in equal or reduced decoding errors than those that may occur from utilizing the standard Viterbi algorithm. After step 510, the receiver 150 may proceed to end step 514.

The layer 1 (L1) parameters, for example, timing and power parameters may not change significantly between successive iterations. For example, the L1 parameters between successive iterations may vary by a small threshold, for example, 20%. The layer 3 (L3) bits of the previous SACCH and the current SACCH may be required to be similar or within a small threshold. The similarity may be checked by calculating the Hamming distance between the two L3 sequences. If the Hamming distance is greater than a threshold, then the layer 3 (L3) bits of the previous SACCH and the current SACCH may not be similar. For GSM applications, for example, the redundancy algorithm may comprise searching for the MLSE that may also meet the Fire code verification test condition and the L1 and L2 constraints described above. In this regard, a set of k bit sequences {S1, S2, . . . , Sk} may be determined from the MLSE that meet the Fire code verification test. Once the set of k sequences is determined, a best sequence, Sb, may be determined that also meets the GSM L1 & L2 constraints. K is a parameter that may be greater or equal to 1 and may be chosen to meet complexity, performance and MIPS considerations.

Figure 6:
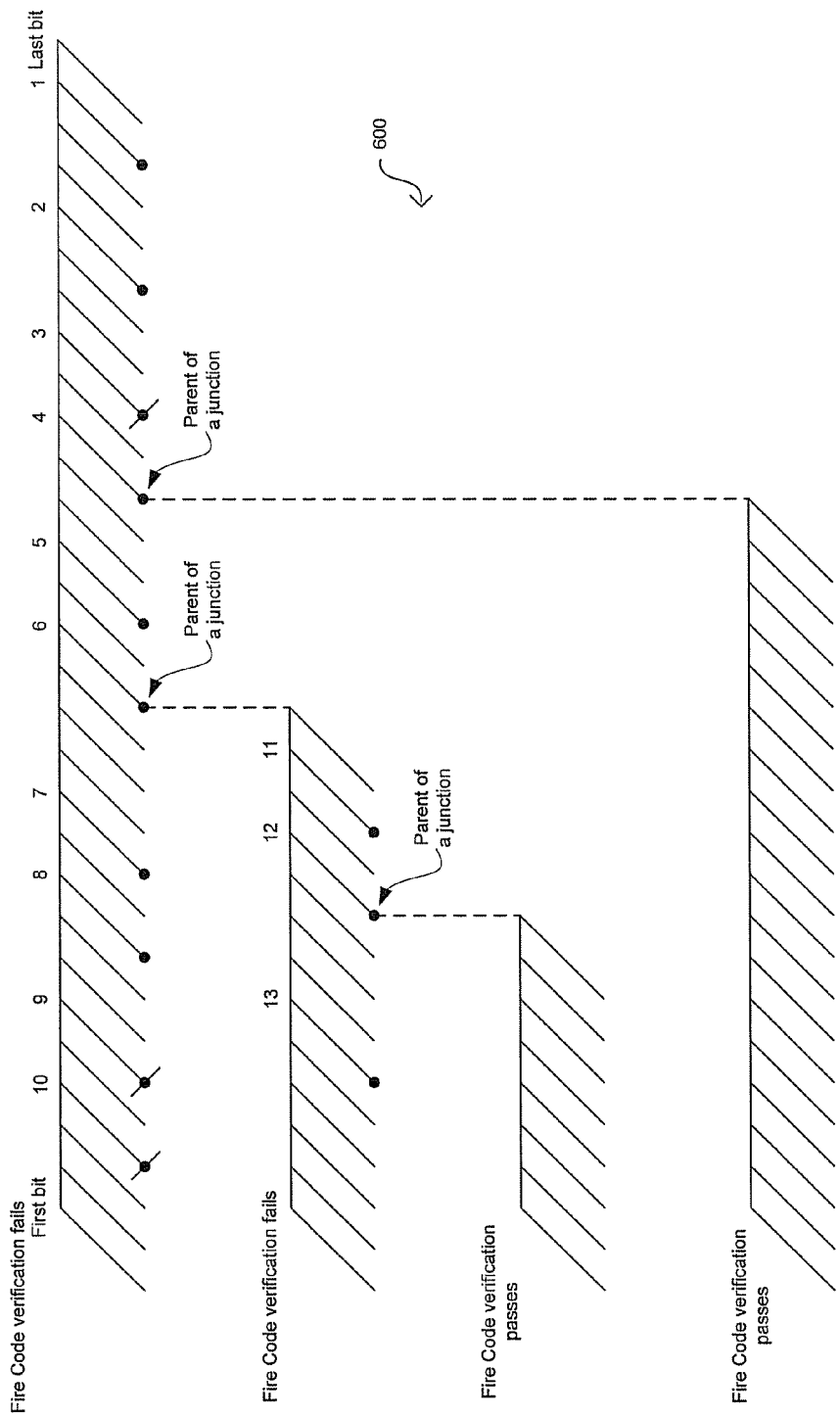
FIG. 6 is diagram illustrating an exemplary search process for a T hypothesis that meets Fire Code verification constraint, in accordance with an embodiment of the invention.

FIG. 6 is diagram illustrating an exemplary search process for a T hypothesis that meets Fire Code verification constraint, in accordance with an embodiment of the invention. Referring to FIG. 6, the search tree 600 may correspond to an exemplary sequence search process that may start with the reduced set of estimated bit sequences generated by a Viterbi operation. In this regard, the top horizontal row corresponds to a set of N trellis junctions that may result from the Viterbi operation. The main sequence metric and the metric of main sequence junctions may be obtained during the Viterbi calculation. The metric of other sequences may be obtained from the sum of the parent sequence metric and the junction metric. Each of the trellis junctions is shown as a diagonal line and corresponds to an estimated bit sequence from the Viterbi operation. The estimated bit sequences in the top row do not meet the Fire Code verification constraint. In the redundancy algorithm, a set of estimated bit sequences may be selected from those in the top row. As shown, 10 estimated bit sequences may be selected, for example, from the N trellis junctions. The 10 selected estimated bit sequences may be shown as having a dark circle at the end of the diagonal line. In this regard, the selection may depend on a metric parameter, where the metric parameter may, in some instances, comprise a channel metric portion and a physical constraint metric portion.

The search process for a T hypothesis that meets the Fire Code verification or redundancy verification parameter for GSM may start with the selected trellis junction with the highest metric. In this example, the junction labeled 6 has the highest metric and the search process may start at that point. A new search tree 600 branch or row may be created from the junction labeled 6 and a trace back pointer may be utilized to track the search operation. The new branch or row results in three additional estimated bit sequences or three junctions labeled 11 through 13. As a result, the three junctions in the top row with the lowest metrics, junctions 3, 9, and 10, may be dropped. This is shown by a small dash across the dark circle at the end of the diagonal line. Again, the new branch or row is verified for Fire Code verification. As shown, the Fire Code verification fails for this new branch and a next branch may be created from the junction with the highest metric or junction 12 as shown. In this instance, the branch that results from junction 12 meets the Fire Code verification constraint and the search process may return to the top row and to the junction with the next highest metric. The estimated bit sequence associated with junction 12 may be selected as one of the bit sequences for the set of k sequences {S1, S2, . . . , Sk}.

Junction 4 represents the next highest metric after junction 6 on the top row and a new branch or row may be created from junction 4. In this instance, the new branch meets the Fire Code verification constraint and the estimated bit sequence associated with junction 4 may be selected as one of the bit sequences for the set of k sequences {S1, S2, . . . , Sk}. This approach may be followed until the limit of k sequences is exceeded or the search from all the remaining selected junctions is performed. In this regard, a plurality of trace back pointers may be calculated during the search operation. The size of the set of k bit sequences {S1, S2, . . . , Sk} may vary.

Figure 7:
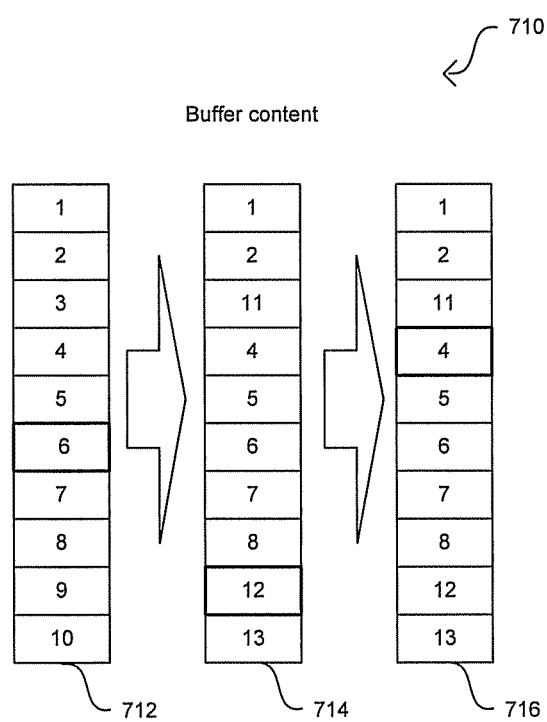
FIG. 7 is a diagram illustrating exemplary buffer content during the search process described in FIG. 6, in accordance with an embodiment of the invention.

FIG. 7 is a diagram illustrating exemplary buffer content during the search process described in FIG. 6, in accordance with an embodiment of the invention. Referring to FIG. 7, there is shown a buffer content 710 that may correspond to the junction labels under consideration during the search process. For example, state 712 may correspond to the initial 10 junctions in the search operation. In this regard, junction 6 is highlighted to indicate that it corresponds to the highest metric value and is the starting point of a new branch or row. Step 714 may correspond to the next set of 10 junctions. In this instance, junctions 3, 9, and 10 have been replaced with junctions 11, 12, and 13 that resulted from the branch created from junction 6. Junction 12 is highlighted to indicate that is corresponds to the highest metric value and is the starting point of a new branch or row. State 716 may correspond to the next set of 10 junctions. In this instance, junction 4 is highlighted to indicate that is corresponds to the highest metric value and is the starting point of a new branch or row. Trace back pointers may be calculated at each state to track the search process.

Figure 8:
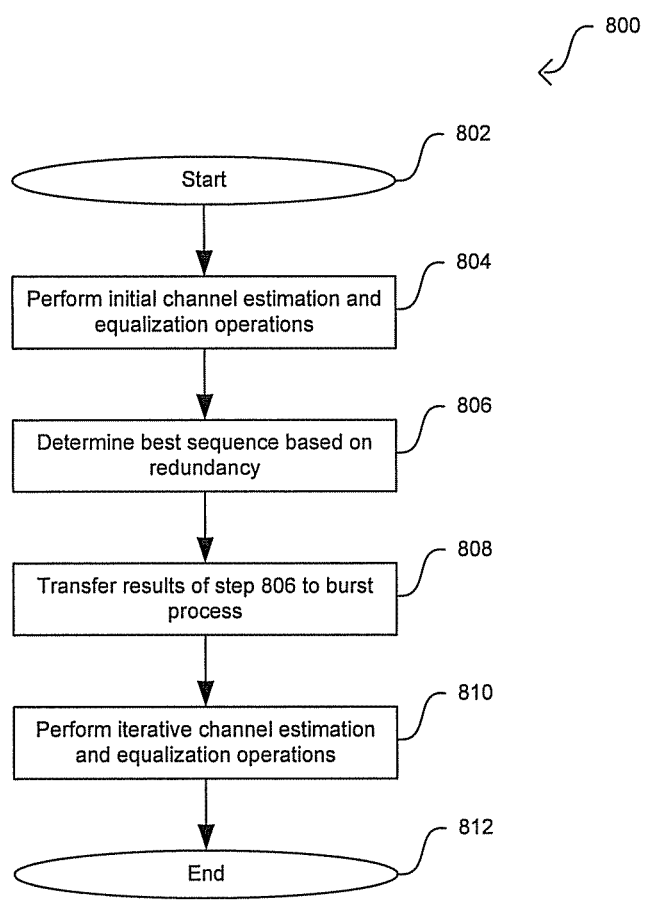
FIG. 8 is a flow diagram illustrating exemplary steps in the iterative multilayer approach for improving decoding, in accordance with an embodiment of the invention.

FIG. 8 is a flow diagram illustrating exemplary steps in the iterative multilayer approach for improving decoding, in accordance with an embodiment of the invention. Referring to FIG. 8, after start step 802, in step 804, an initial or first iteration of a channel estimation operation and of an equalization operation may be performed on received signals during a burst process portion of the multilayer decoding approach. The first iteration of the channel estimation operation and the first iteration of the equalization operation may be performed by, for example, the burst process block 102 in FIG. 4B. In step 806, decoding of a received signal frame may be performed during the frame processing portion of the multilayer decoding approach. The frame processing may be performed by, for example, the frame process block 106 in FIG. 4B. In step 808, at least a portion of the results generated in step 806 by the frame process portion of the multilayer decoding approach may be transferred from, for example, the frame process block 106 to the burst process block 102 via a feedback signal. In step 810, the burst processing may perform a second iteration of the channel estimation operation and a second iteration of the equalization operation based on the decoded results provided from the frame process portion of the multilayer decoding approach. After step 810, the flow diagram 800 may proceed to end step 812. The improved results of the burst process may be further interleaved and processed by the frame process. The frame process may utilize a standard frame process or determine the best sequence that may be utilized based on, for example, redundancy.

Figure 9:
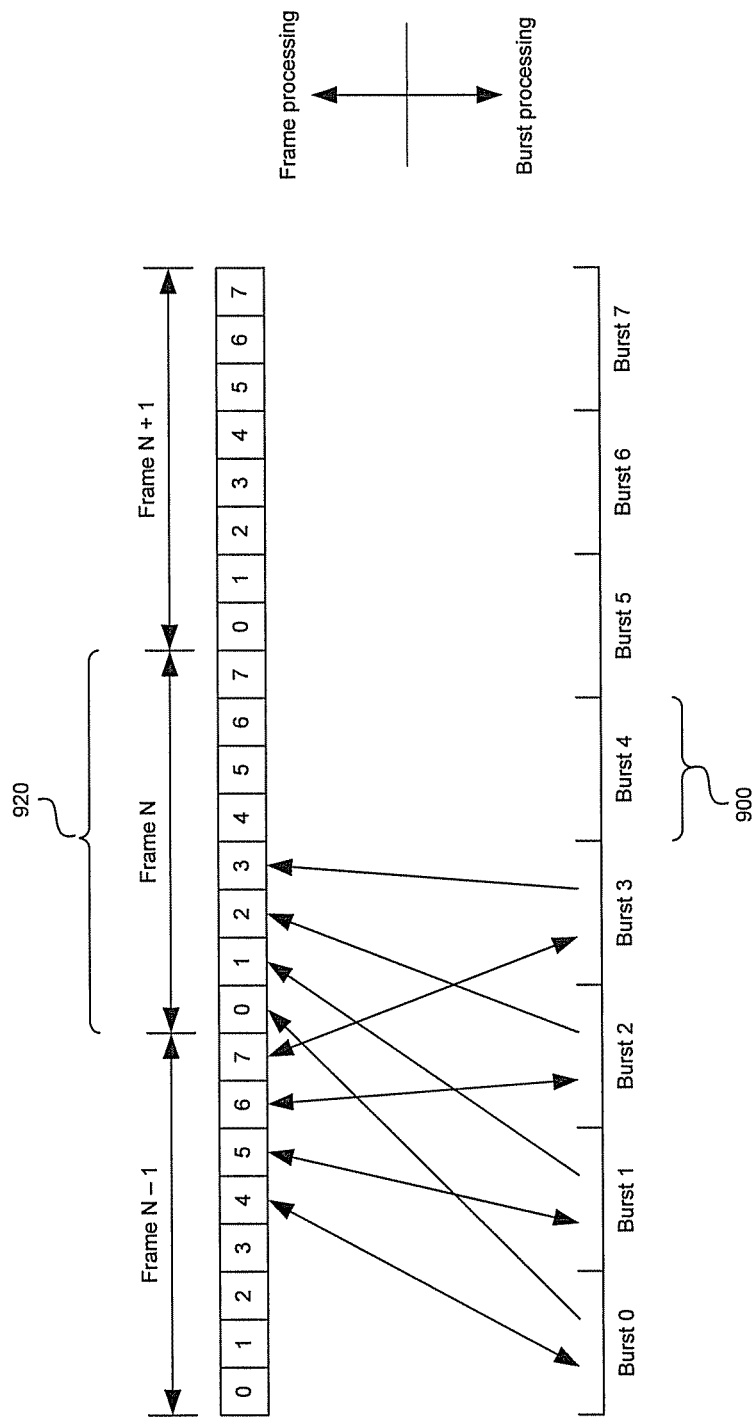
FIG. 9 is a diagram illustrating exemplary iterative frame and burst processes in GSM applications, in accordance with an embodiment of the invention.

FIG. 9 is a diagram illustrating exemplary iterative frame and burst processes in GSM applications, in accordance with an embodiment of the invention. Referring to FIG. 9, there is shown a series of at least one time slot burst 900 and a series of at least one frame 920. The series of at least one time slot burst 900 may correspond to Burst 0 through Burst 7, while the series of at lest one frame 920 may correspond to Frame N−1 through Frame N+1.

There may be two types of iterative processes to consider: a causal iterative process and a non-causal iterative process. For the causal iterative process, Burst 0 through Burst 3 may each have 57 data bits from the first data bits portion of the time slot burst 900 that have been decoded during the frame processing of Frame N−1. Utilizing the decoded 57 data bits in each of Burst 0 through Burst 3 and the 26 bits in the midamble, the burst process may be recalculated or a second iteration of the burst process may occur. In this regard, the channel estimation operation of the burst process may be improved by utilizing the decoded data bits generated by the frame process during a second iteration. Moreover, the MLSE in the channel equalization operation of the burst process may consider that the decoded data bits are known with a higher probability than during the first iteration. In some instances, to reduce the complexity that may be introduced by a second iteration operation, the burst process may perform a second iteration on selected time slot bursts determined during the first iteration. In this regard, a particular time slot burst may be selected for a second iteration when it is associated with having a low carrier-to-interference (C/I) value, for example. Once the burst process improves the data, it may be further interleaved and processed by the frame process. The frame process my use a standard frame process or determine the best sequence based on, for example, the redundancy For the non-causal iterative process, bits from Burst 0 through Burst 7 may be needed to recalculate the burst process for bit sequences that may be transferred to Frame N. Data from Frame N−1 and/or data from Frame N+1 may be utilized to calculate the burst process for bit sequences that may be transferred to Frame N. Utilizing the decoded 114 data bits in each of Burst 0 through Burst 7 and the 26 bits in the midamble, the burst process may be recalculated. As with the causal iterative process, a particular time slot burst may be selected for a second iteration when it is associated with having a low carrier-to-interference (C/I) value, for example.

Figure 10:
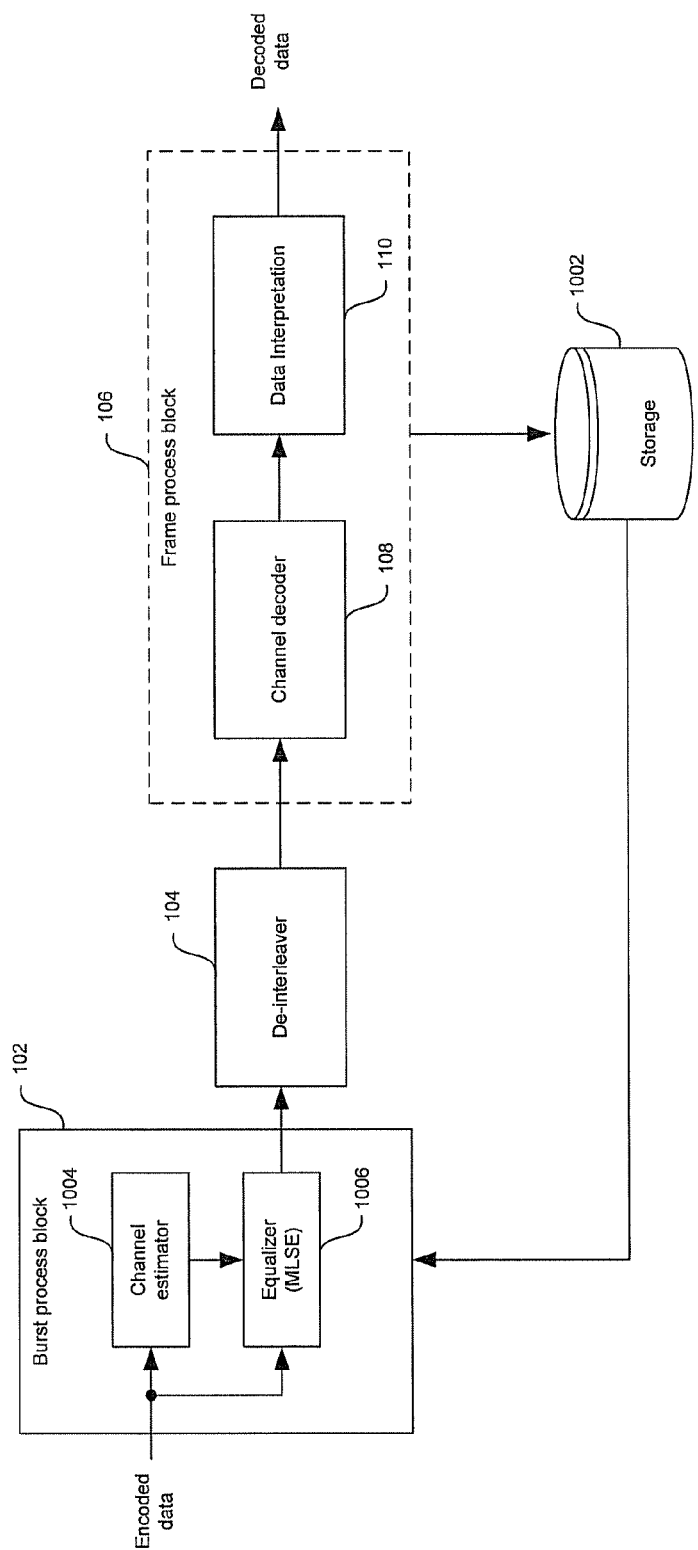
FIG. 10 is a block diagram illustrating exemplary non-causal iterative system, in accordance with an embodiment of the invention.

FIG. 10 is a block diagram illustrating an exemplary non-causal iterative system, in accordance with an embodiment of the invention. Referring to FIG. 10, there is shown the burst process block 102, the de-interleaver 104, the frame process block 106, the channel decoder 108, the data interpretation block 110, and a storage 1002. The burst process block 102 is shown to comprise a channel estimator 1004 and an equalizer 1006. The storage 1002 may comprise suitable logic, circuitry, and/or code that may store data associated with the frame process of a previously processed frame. The channel estimator 1004 may comprise suitable logic, circuitry, and/or code that may perform channel estimation operations during the burst process. The equalizer 1006 may comprise suitable logic, circuitry, and/or code that may perform MLSE channel equalization operations during the burst process.

In operation, data stored in the storage 1002 that resulted from a frame process operation may be transferred to the channel estimator 1004 and/or the equalizer 1006 for a second iteration of the burst process for the Frame N. In this regard, the data stored in the storage 1002 may comprise information regarding the time slot bursts in the burst process that may be utilized during the second iteration of the burst process for the Frame N.

When using the 57 data bits and the 26 midamble bits in the causal iterative process or when using 114 data bits and the 26 midamble data bits in the non-causal iterative process, hard decision values or soft decision values for the data bits may be utilized during the second iteration of the burst process. In some instances, soft decision values may be preferred for a particular application.

The channel estimator 1004 in FIG. 10 may perform a soft decision for the burst process. For example, for Gaussian minimum shift keying (GMSK) modulation, the estimated channel may be given by the expression:

$$\hat{W}(m) = \frac{1}{\text{Gain}} \cdot \sum_{n=0}^{N} j^n \cdot x_n \cdot S(m+n),$$

where $\hat{A}_n = j^n \cdot \overline{A}_n$ and $\overline{A}_n = \pm 1$, and the soft reference is given by $x_n = \alpha_n \cdot \overline{A}_n$, where $\alpha_n$ is a weight of the soft decision, and m=0, 1, 2, . . . 7. In this regard, the gain for the estimated channel may be given by the expression:

$$\text{Gain} = \sum_{n=0}^{N} \frac{|x_n|}{(1 - 2 \cdot P_{ER}^n)},$$

where N=147, and $$x_n = \begin{cases} \pm 1 & \text{If (Bit } \in \textit{Midamble}) \\ 0.3625 \cdot SD_n / 15 & \text{If (Bit } \in \textit{Prev} - \text{Iteration}), \end{cases}$$

where $SD_n$ refers to a soft decision value. The gain for the estimated channel may be simplified to the expression:

$$\text{Gain} = \sum_{n=0}^{N} \frac{|x_n|}{(1-2 \cdot P_{ER}^n)} \approx 0.825 \cdot \sum_{n=0}^{147} |x_n|.$$

The offset and the estimation may be determined by the expression $$E(Ofser) = \sum_{k=0}^{4} |\hat{W}(k + \text{Offset})|^2.$$

In instances when the equalizer 1006 in FIG. 10 is not adapted to handle the results from a previous iteration, a gradient search approach may be utilized for the second iteration in the burst process. In this regard, the first iteration may be performed in hardware and at least a portion of the second iteration may be performed in software, for example.

Figure 11:
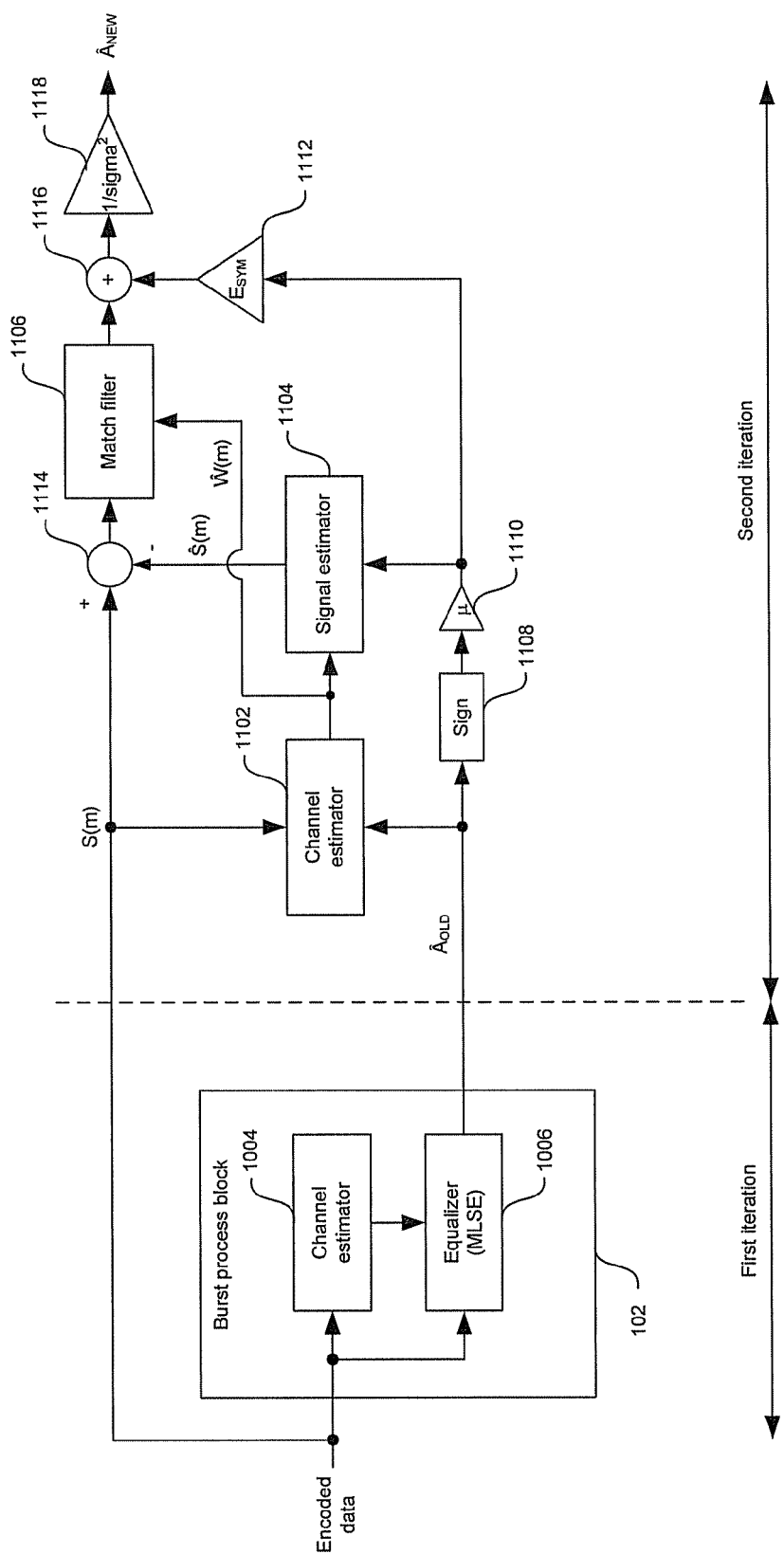
FIG. 11 is a block diagram illustrating exemplary implementation of a second burst process iteration based on a gradient search approach, in accordance with an embodiment of the invention.

FIG. 11 is a block diagram illustrating an exemplary implementation of a second burst process iteration based on a gradient search approach, in accordance with an embodiment of the invention. Referring to FIG. 11, the gradient search in the second iteration of the burst process may be implemented utilizing suitable logic, circuitry, and/or code and may comprise a channel estimator 1102, a signal estimator 1104, a match filter 1106, a sign converter 1108, a converger 1110, an energy estimator 1112, a first adder 1114, a second adder 1116, and a gain stage 1118.

The gradient search approach is based on finding the minimal distance H between a received and an estimated signal. The minimal distance H may be given by the expression:

$$H = \int \left(S(t) - \hat{S}(t)\right)^2 dt,$$

where $$\hat{S}(t) = \sum_{k=0}^{K} \hat{A}_k \cdot \hat{W}(t - k \cdot T_{SYM}),$$

$\hat{A}_k$ is the $k^{th}$ element of the estimated symbols vector, and $\hat{W}(t)$ is the estimated symbol waveform. The gradient may be given by the expression:

$$G = \frac{\partial H}{\partial \hat{A}},$$

and $$G_k(\hat{A}) = \int \left(conj(\hat{W}(t-k \cdot T_{SYM})) \cdot \left(S(t) - \sum_{m=-\infty}^{+\infty} \hat{A}_m \cdot \hat{W}(t - m \cdot T_{SYM})\right)\right) dt,$$

where $G_k$ is the $k^{th}$ element of gradient vector.

The signal estimator 1104 may comprise suitable logic, circuitry, and/or code that may perform a signal estimation operation based on the following expression:

$$I(t) = \text{SignalEstimation}(\hat{A}) = \sum_{k=-\infty}^{+\infty} \hat{A}_k \cdot \hat{W}(t - k \cdot T_{SYM}).$$

The match filter 1106 may comprise suitable logic, circuitry, and/or code that may perform a match filtering operation based on the following expression:

$$G_k = \text{MatchFilter}(S(t)-I(t)) = \int (conj(\hat{W}(t-k \cdot T_{SYM})) \cdot (S(t)-I(t))) \cdot dt.$$

The gradient expression may be written as:

$$G_k(\hat{A}) = \text{MatchFilter}(S(t) - \text{SignalEstimation}(\hat{A})).$$

Using the gradient expression, the value of $\hat{A}$ may be estimated by the following iteration equation:

$$\hat{A}_{NEW} = \mu \cdot E_{SYM} \cdot \hat{A}_{OLD} + G_k(\mu \cdot \hat{A}\text{old}),$$

where $\mu$ is a convergence coefficient that may be provided by the converger 1110 and that may be given by the expression $$\mu = \frac{1}{\text{IterNum}},$$

where IterNum may correspond to the number of iterations, and $$E_{SYM} = \int |\hat{W}(t)|^2 \cdot dt,$$

may correspond to the energy of the estimated channel $\hat{W}(t)$ provided by the energy estimator 1112. The gain stage 1118 may comprise suitable logic, circuitry, and/or code that may generate a normalization of the output soft decision generated by the second adder 1116 to additive noise power (sigma^2). In some instances, the noise power may equal to the mean square error of estimation:

$$E_{NOISE} = sigma^2 = \frac{1}{T_{BURST}} \cdot \int_{T_{BURST}} \left(S(t) - \hat{S}(t)\right)^2 dt.$$

The approach described herein may result in fewer decoding bit errors than may occur by a single iteration of the standard Viterbi algorithm. The use of an iterative multilayer process that utilizes redundancy and physical constraints may be efficiently implemented in the design of optimized receivers for decoding convolutional encoded data.

Figure 12:
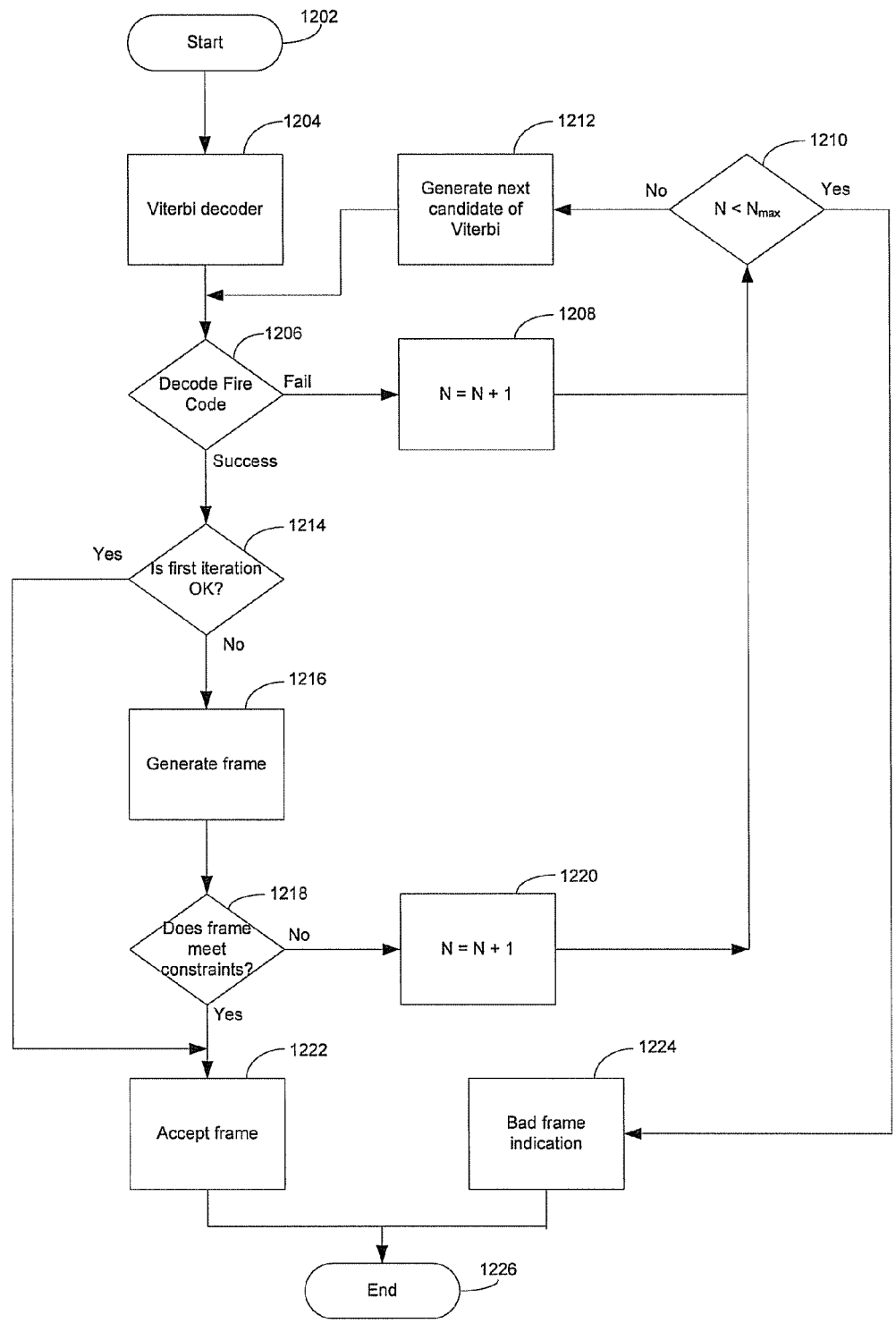
FIG. 12 is a flow diagram illustrating exemplary steps for decoding control data in GSM-based systems using inherent redundancy, in accordance with an embodiment of the invention.

FIG. 12 is a flow diagram illustrating exemplary steps for decoding control data in GSM-based systems using inherent redundancy, in accordance with an embodiment of the invention. Referring to FIG. 12, exemplary steps may begin at step 1202. In step 1204, the receiver 150 in FIG. 4A may decode a received frame in the frame process block 156 by utilizing the Viterbi algorithm. In step 1206, Fire decoder is used and a verification test is performed. In step 1206, the receiver 150 may determine whether the Fire Code decoding was successful. If Fire Code decoding was not successful, control passes to step 1208. In step 1208, the iteration counter value, N, may be incremented. In step 1210, it may be determined whether the iteration counter value, N, has reached a maximum value, $N_{max}$. If the iteration counter value, N, has reached the maximum value $N_{max}$, control passes to step 1224. In step 1224, a bad frame indication is generated. Control then passes to end step 1226. If the iteration counter value, N, has reached the maximum value $N_{max}$, control passes to step 1212. In step 1212, the next candidate for the Viterbi decoder may be generated. Control passes back to step 1204.

Returning to step 1206, if Fire Code decoding was successful, control passes to step 1214. In step 1214, it may be determined whether the decoded frame is satisfactory and the iteration counter value, N is equal to 1. If the decoded frame is satisfactory at the first iteration, namely the iteration counter value, N is equal to 1, control passes back to step 1222. In step 1222, the decoded frame may be accepted. Control then passes to end step 1226. If the iteration counter value, N is more than 1, control passes to step 1216. In step 1216, the decoded frame may be generated. In step 1218, it may be determined whether the generated frame meets the physical constraints based on the GSM slow associated control channel (SACCH). The layer 1 (L1) parameters, for example, timing and power parameters may not change significantly between successive iterations. For example, the L1 parameters between successive iterations may vary by a small threshold, for example, 20%. The layer 3 (L3) bits of the previous SACCH block and the current SACCH block may be required to be similar or within a small threshold. The similarity may be checked by calculating the Hamming distance between the two L3 sequences. If the Hamming distance is greater than a threshold, then the layer 3 (L3) bits of the previous SACCH block and the current SACCH block may not be similar.

In step 1218, if the decoded frame does not meet the physical constraints of the SACCH, control passes to step 1220. In step 1220, the iteration counter value, N may be incremented. Control then passes to step 1210. In step 1210, it may be determined whether the iteration counter value, N, has reached a maximum value, $N_{max}$. If the iteration counter value, N, has reached the maximum value $N_{max}$, control passes to step 1224. In step 1224, a bad frame indication is generated. Control then passes to end step 1226. If the iteration counter value, N, has not reached the maximum value $N_{max}$, control passes to step 1212. In step 1212, the next candidate decoder may be generated. Control passes back to step 1206. Returning to step 1218, if the decoded frame meets the physical constraints of the SACCH, control passes to step 1222. In step 1222, the decoded frame may be accepted. Control then passes to end step 1226.

In accordance with an embodiment of the invention, a method and system for decoding control data in GSM-based systems using inherent redundancy may comprise at least one processor, for example, processor 162 that enables generation of a corresponding redundancy verification parameter for a received GSM bit sequence that is decoded using a decoding algorithm. The processor 162 may enable verification of the decoded received GSM bit sequence based on the corresponding redundancy verification parameter. If the decoded received GSM bit sequence fails the verification, the processor 162 may enable decoding of the received GSM bit sequence by imposing at least one physical constraint during decoding by the decoding algorithm. The decoding algorithm comprises a Viterbi algorithm. The processor 162 may enable accepting of the decoded received GSM bit sequence, if the decoded received GSM bit sequence passes the verification. The processor 162 may enable incrementing of an iteration counter, N if the decoded received GSM bit sequence or frame fails the verification. The processor 162 may enable rejecting of the decoded received GSM bit sequence or frame, if the iteration counter, N reaches a maximum value $N_{max}$.

The processor 162 may enable performing of at least one physical constraint test on the decoded received GSM bit sequence. The processor 162 may enable selection of one of the decoded received GSM bit sequence as a decoded output GSM bit sequence based on the performed at least one physical constraint test. The layer 1 (L1) parameters, for example, timing and power parameters may not change significantly between successive iterations. For example, the L1 parameters between successive iterations may vary by a small threshold, for example, 20%. The layer 3 (L3) bits of the previous SACCH block and the current SACCH block may be required to be similar or within a small threshold. The similarity may be checked by calculating the Hamming distance between the two L3 sequences. If the Hamming distance is greater than a threshold, then the layer 3 (L3) bits of the previous SACCH block and the current SACCH block may not be similar. For GSM applications, for example, the redundancy algorithm may comprise searching for the MLSE that may also meet the Fire code verification test condition and the L1 and L3 constraints. In this regard, a set of k bit sequences {S1, S2, . . . , Sk} may be determined from the MLSE that meet the Fire code verification constraint. Once the set of k sequences is determined, a best sequence, Sb, may be determined that also meets the GSM SACCH constraints. At least one physical constraint is based on a GSM slow associated control channel (SACCH). The processor 162 enables decoding a Fire Code to verify the decoded received GSM bit sequence based on the corresponding redundancy verification parameter.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing by a receiver device, the method comprising:
   verifying a received global system for mobile communications (GSM) bit sequence of a current GSM frame signal based on a generated redundancy verification parameter; and
   decoding the received GSM bit sequence based on a variation between a portion of the received GSM bit sequence and a corresponding portion of a second GSM bit sequence if the received GSM bit sequence fails the verifying.

2. The method according to claim 1, further comprising:
   generating the received GSM bit sequence using a Viterbi algorithm.

3. The method according to claim 1, further comprising:
   accepting the received GSM bit sequence if the received GSM bit sequence passes the verification.

4. The method according to claim 1, further comprising:
   incrementing a counter if the received GSM bit sequence fails the verification;
   verifying a second received GSM bit sequence if the counter is less than a predetermined value; and
   decoding the second received GSM bit sequence based on a variation between a portion of the second received GSM bit sequence and a corresponding portion of the received GSM bit sequence if the second received GSM bit sequence fails the verification,
   wherein the received GSM bit sequence and the second received GSM bit sequence are generated using a Viterbi algorithm.

5. The method according to claim 4, further comprising:
   rejecting the received GSM bit sequence if the counter reaches the predetermined value.

6. The method according to claim 1, wherein the portion of the received GSM bit sequence is part of a GSM slow associated control channel (SACCH).

7. The method according to claim 1, further comprising:
   determining a Fire Code for the verification of the received GSM bit sequence based on the generated redundancy verification parameter.

8. The method according to claim 1, wherein the variation comprises at least one of: a variation of layer 1 (L1) parameters between successive iterations of GSM bit sequences generated using a Viterbi algorithm and a variation of layer 3 (L3) bits between a previous slow associated control channel (SACCH) and a current SACCH.

9. The method according to claim 8, further comprising:
   calculating a Hamming distance between the L3 bits of the previous SACCH and the current SACCH to determine whether the L3 bits are within a threshold if the variation between portion of the received GSM bit sequence and a corresponding portion of a second GSM bit sequence comprises the variation of L3 bits between the previous SACCH and the current SACCH.

10. A method for signal processing by a receiver device, the method comprising:
    determining whether a received global system for mobile communications (GSM) bit sequence passes a verification based on a determined Fire Code;
    determining whether the received GSM bit sequence meets a constraint imposed during a decoding; and
    accepting a decoded received GSM bit sequence if the decoded received GSM bit sequence passes the verification and meets the constraint,
    wherein the constraint comprises at least one of: a threshold of a variation of layer 1 (L1) parameters between successive iterations of GSM bit sequences generated using a Viterbi algorithm or a threshold of a variation between layer 3 (L3) bits of a slow associated control channel (SACCH) of a decoded previous GSM bit sequence and a decoded current GSM bit sequence.

11. A system for processing a received signal comprising:
    a radio frequency block comprising circuitry configured to receive global system for mobile communications (GSM) frame signals; and
    one or more circuits or processors coupled to the radio frequency block and configured to:
    verify a received GSM bit sequence of a current GSM frame signal based on a generated redundancy verification parameter; and
    decode the received GSM bit sequence based on a variation between a portion of the received GSM bit sequence and a corresponding portion of a second GSM bit sequence if the received GSM bit sequence fails the verification.

12. The system according to claim 11, wherein the one or more circuits or processors are further configured to generate the received GSM bit sequence using a Viterbi algorithm.

13. The system according to claim 11, wherein the one or more circuits or processors are further configured to accept the received GSM bit sequence if the received GSM bit sequence passes the verification.

14. The system according to claim 11, wherein the one or more circuits or processors are further configured to increment a counter if the received GSM bit sequence fails the verification;
    verify a second received GSM bit sequence if the counter is less than a predetermined value; and
    decode the second received GSM bit sequence based on a variation between a portion of the second received GSM bit sequence and a corresponding portion of the received GSM bit sequence if the second received GSM bit sequence fails the verification,
    wherein the received GSM bit sequence and the second received GSM bit sequence are generated using a Viterbi algorithm.

15. The system according to claim 14, wherein the one or more circuits or processors are further configured to reject the received GSM frame signal if the counter reaches the predetermined value.

16. The system according to claim 11, wherein the portion of the received GSM bit, sequence is part of a GSM slow associated control channel (SACCH).

17. The system according to claim 11, wherein the one or more circuits or processors are further configured to determine a Fire Code for the verification of the received GSM bit sequence based on the generated redundancy verification parameter.

18. The system according to claim 11, wherein the variation comprises at least one of: a variation of layer 1 (L1) parameters between successive iterations of GSM bit sequences generated using a Viterbi algorithm and a variation of layer 3 (L3) bits between a previous slow associated control channel (SACCH) and a current SACCH.

19. The system according to claim 18, wherein the one or more circuits or processors are further configured to calculate a Hamming distance between the L3 bits of the previous SACCH and the current SACCH to determine whether the L3 bits are within a threshold if the variation between a portion of the received GSM bit sequence and corresponding portion of a second GSM bit sequence comprises the variation of L3 bits between the previous SACCH and the current SACCH.

20. The system according to claim 11, wherein the one or more circuits or processors are further configured to decode the received GSM bit sequence based on determining a maximum-likelihood sequence estimate for the received GSM bit sequence.

\* \* \* \* \*

UNITED STATES PATENT AND TRADEMARK OFFICE
CERTIFICATE OF CORRECTION

| | | |
|---|---|---|
| PATENT NO. | : 8,924,830 B2 | Page 1 of 1 |
| APPLICATION NO. | : 13/277017 | |
| DATED | : December 30, 2014 | |
| INVENTOR(S) | : Heiman et al. | |

It is certified that error appears in the above-identified patent and that said Letters Patent is hereby corrected as shown below:

Title page, (63) of the Related U.S. Application Data, replace "and a continuation-in-part" with --which is a continuation-in-part--.

In the Specification

In column 17, line 52, replace "between portion" with --between a portion--.

Signed and Sealed this
Nineteenth Day of May, 2015

Michelle K. Lee
*Director of the United States Patent and Trademark Office*